United States Patent [19]

Reimer

[11] 3,818,416

[45] June 18, 1974

[54] DEVICE FOR SOLDERLESS CONNECTION OF ELECTRICAL COMPONENTS TO PRINTED WIRING CARDS

[75] Inventor: William A. Reimer, Wheaton, Ill.

[73] Assignee: GTE Automatic Electric Laboratories, Incorporated, Northlake, Ill.

[22] Filed: Apr. 17, 1973

[21] Appl. No.: 351,937

[52] U.S. Cl. .......................... 339/17 CF, 339/75 MP
[51] Int. Cl. .......................... H01r 13/54
[58] Field of Search .......... 317/101 CP; 339/17 CF, 339/17 C, 17 D, 75 M, 75 MP, 176 M, 273, 274

[56] References Cited

UNITED STATES PATENTS

| | | | |
|---|---|---|---|
| 2,926,340 | 2/1960 | Blain et al. | 339/17 CF X |
| 2,982,883 | 5/1961 | Gordy | 339/75 MP X |
| 3,315,212 | 4/1967 | Peterson | 339/75 M |
| 3,489,986 | 1/1970 | Frederick | 339/75 M X |
| 3,571,780 | 3/1971 | Boenning et al. | 339/75 M X |
| 3,629,788 | 12/1971 | Hartley | 339/18 B |

OTHER PUBLICATIONS

IBM Technical Disclosure Bulletin, Vol. 12, No. 8, Jan. 1970, "Card–To–Board Pluggable Contact System" Pittwood et al.

*Primary Examiner*—Bobby R. Gay
*Assistant Examiner*—Terrell P. Lewis
*Attorney, Agent, or Firm*—Robert F. Van Epps

[57] ABSTRACT

A device for connecting the leads of electrical components to plated through holes in a printed wiring card wherein two overlapping lead deflector elements are disposed such as to be laterally translatable with respect to one another. A cam locking post operates to translate the deflector elements which engage the component leads and urge them into electrical contact with the plated through holes in which the leads are inserted.

6 Claims, 5 Drawing Figures

DEVICE FOR SOLDERLESS CONNECTION OF ELECTRICAL COMPONENTS TO PRINTED WIRING CARDS

BACKGROUND OF THE INVENTION

1. Field of the Invention

The present invention relates generally to the field of electrical connectors and more particularly to a new and novel device for connecting the leads of electrical components to the plated through holes of a printed wiring card.

2. Description of the Prior Art

Prior to the present invention when multiple lead electrical components such as dual in-line packaged integrated circuits were to be connected to printed wiring cards it was common to employ a connector socket. This sort of pluggable arrangement was considered desirable from the standpoint of facilitating circuit testing and because component replacement was more easily performed.

While the pluggable connector socket has become widely used it continues to exhibit several shortcomings. First, the prior art connector socket generally must be solder terminated to the printed wiring card and thus does not offer any savings in the initial assembly. Secondly, the connector socket, in being mounted to the surface of the printed wiring card, serves to add to the overall component height and lead projection from the card. Finally, most pluggable connector sockets have relatively high insertion forces which may result in damage to the electrical component.

OBJECTS AND SUMMARY OF THE INVENTION

From the preceding discussion it will be understood that among the various objectives of the present invention are included the following:

the provision of a new and improved device for connecting electrical components directly to the plated through holes of printed wiring cards;

the provision of a device of the above-described character which does not alter the component height above, or projection through, the printed wiring cards; and the provision of a device of the above-described character which is electrically inert.

These and other objectives of the present invention are efficiently met by providing a conventional printed wiring card having a plurality of plated through holes in a pattern adapted to receive the leads of an electrical component. First and second overlapping lead deflector elements are disposed on the surface of the wiring card and form an electrical component receiving aperture about the plurality of plated through holes. The deflector elements are laterally translatable with respect to one another such as to enlarge and reduce the aperture and are retained on the wiring card and translated by cam locking posts. By rotating the cam locking posts the lead deflector elements engage the leads of the electrical component and urge them into reliable electrical contact with the plated through holes of the wiring card and retain the electrical component in position.

The foregoing as well as other objects, features and advantages of the present invention will become more easily understood from the following detailed description taken in conjunction with the several views of the appended drawings.

DESCRIPTION OF THE PREFERRED EMBODIMENT

Figure 1:
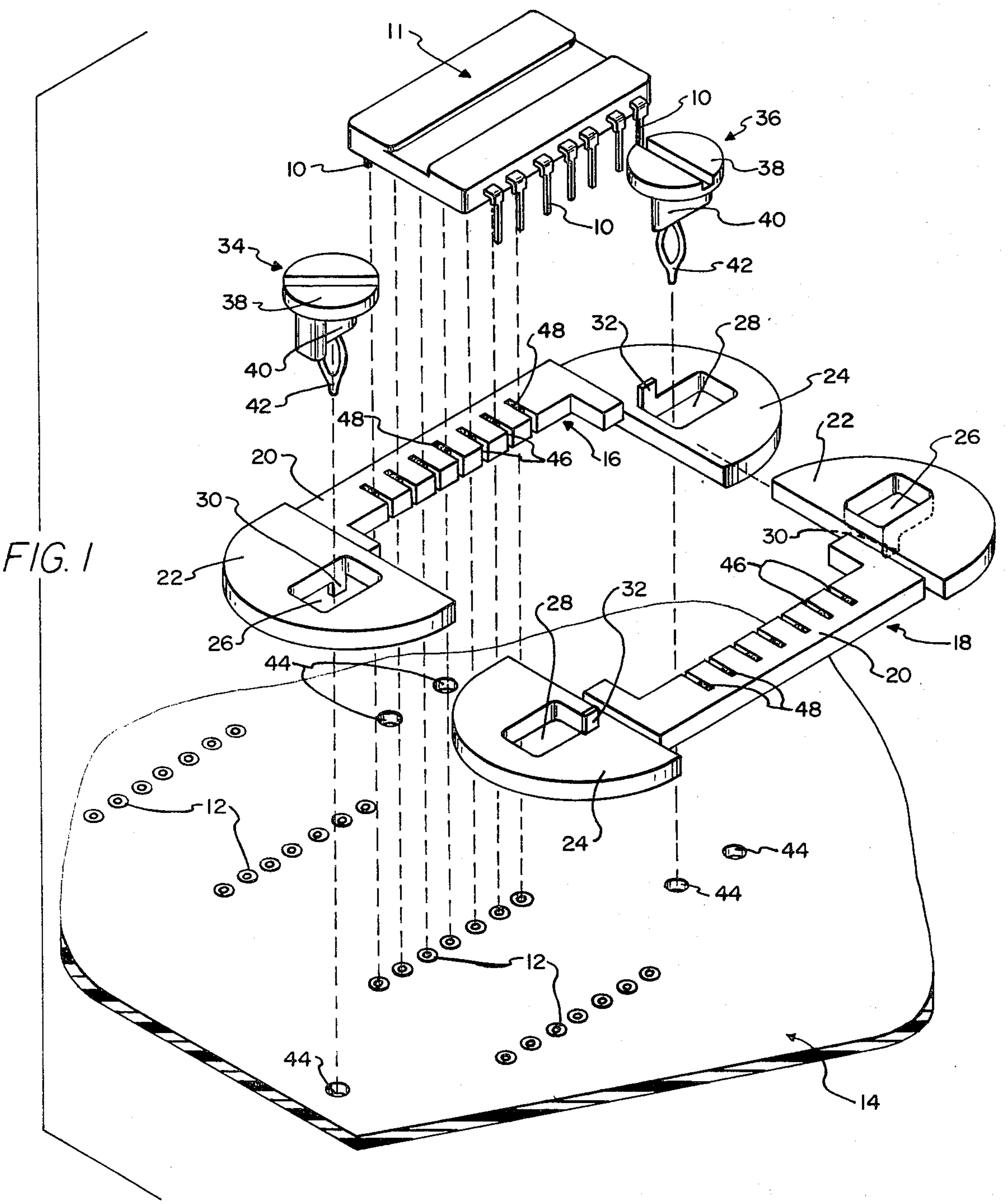
FIG. 1 is an exploded view of a lead deflecting connector device in accordance with the present invention.
Figure 2:
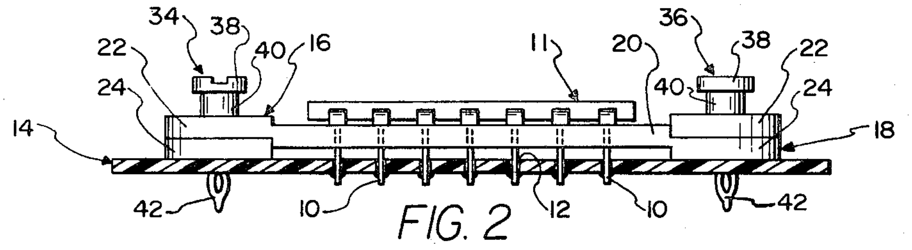
FIG. 2 is a vertical cross-section view of the assembly of FIG. 1.
Figure 3A:
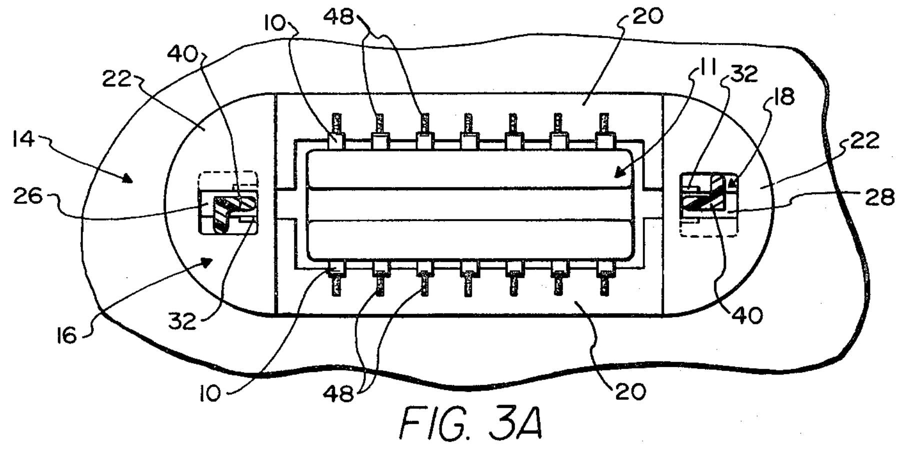
FIGS. 3A and 3B are top views of the apparatus of FIG. 1 in the open and closed positions respectively.
Figure 3B:
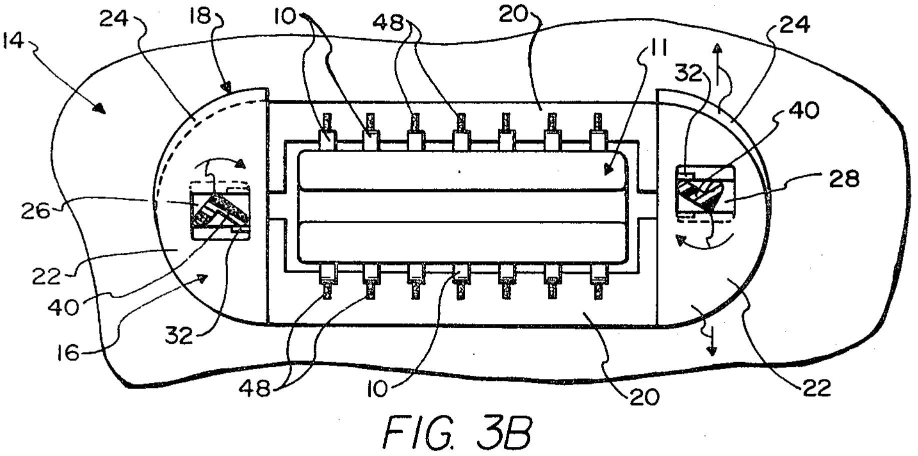

With reference now to FIGS. 1, 2, 3A and 3B there is shown an embodiment of the present invention which is of particular utility in connecting the leads 10 of a conventional dual in-line packaged integrated circuit 11 to the plated through holes 12 in a printed wiring card 14. The connector device includes first and second substantially identical lead deflector elements 16 and 18, each having a lead engaging portion 20 extending longitudinally between flat end portions 22 and 24. The plane of the end portion 22 is offset slightly above that of the lead engaging portion and the plane of the end portions 24 is offset slightly below. With this construction, when one lead deflector faces the other, end portions 22 and 24 engage one another in an overlapping manner and abut the ends of the lead engaging portion 20. The two lead deflector elements 16 and 18 thus are laterally translatable with respect to one another.

Each end portion 22 and 24 is provided with a rectangular mounting aperture 26 and 28 respectively. These mounting apertures are of the same dimensions, however, they are disposed such that the aperture 26 in end portion 22 is partially misaligned with the aperture 28 in end portion 24 when the end portions 22 and 24 are in vertical alignment with one another. Each end portion 22 and 24 of the lead deflector elements 16 and 18 is further preferred to be provided with an outwardly extending tab 30, and 32 respectively, disposed such as to extend into the mounting aperture in the end portions of the other. These tabs thus operate to limit the maximum lateral travel of the lead deflector elements with respect to one another.

The two overlapping lead deflector elements 16 and 18 are mounted to the printed wiring card 14 by first and second locking posts 34 and 36 which include a head portion 38, a cam surface portion 40 extending from the head, and a friction lock 42 extending from the cam surface portion. The locking posts are passed through the apertures 26 and 28 and the friction lock 42 is inserted into apertures 44 in the printed wiring card 14 to retain the assembly on the card.

The electrical component leads 10 are inserted between the lead engaging portions 20 of the lead deflector elements 16 and 18 and into their respective plated through holes 12 in the printed wiring card 14.

Initially the cam surface portion 40 of the locking posts 34 and 36 extend only through the upper one of the overlapping end portions 22 and 24 of the lead deflector elements 16 and 18. Both locking posts are then rotated until the cam surfaces 40 move to the lead deflector elements a lateral distance sufficient to align the apertures 26 and 28 such that the cam surface portion may pass through the lower one of the end portions and rest on the surface of printed wiring card 14. In the illustrated embodiment this cam action operates to move the lead deflector elements 16 and 18 toward one another such that the electrical leads 10 are deflected inwardly by the lead engaging portions 20 into electrical contact with the plated through holes 12 in the printed wiring card 14. Since the component leads 10 are placed under compression against the plated through holes 12 reliable electrical contact is maintained without any requirement that the component be soldered to the printed wiring card. The resulting outward forces on the lead deflector elements 16 and 18 serve to clamp the locking posts 35 and 36 in place such that accidental disengagement and release of the connector device is prevented.

To remove the electrical component 11 the locking posts are simply withdrawn to the point that the cam surface portion disengages the lower one of the overlapping end portions. The lead deflector elements thus may be restored to their original position and the lead engaging forces are removed.

Figure 4:
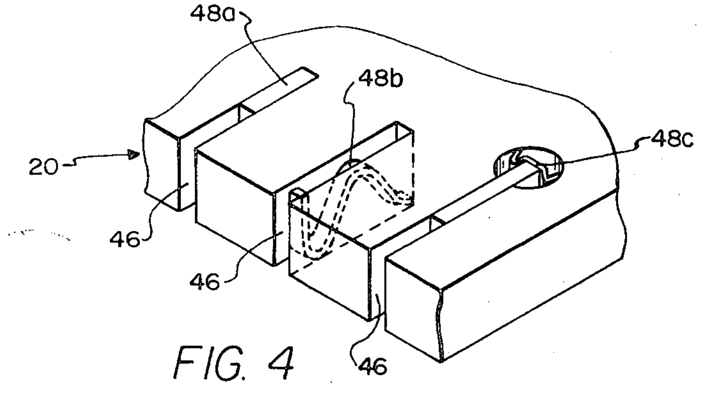
FIG. 4 is a more detailed view of alternative component lead engaging arrangements.

It is preferred in, although not essential to, the practice of the present invention that each lead engaging portion 20 of the lead deflector elements by provided with a series of spaced apart notches 46 for individually engaging each lead of the electrical components that are to be accommodated. It is further preferred that these notches 46 be at least partially filled with a resilient element 48. FIG. 4 is a partial view of a lead engaging portion and illustrates three such resilient elements useful with the present invention. The first and simplest of the resilient elements 48*a* is a rectangular block inserted in the notch 46. Alternatively, a flat springlike element 48*b* or leaf spring and block type of element such as 48*c* may be used. In each case the resilient element 48 would be formed of an electrically nonconductive material as are the lead deflector elements 16 and 18.

It will be seen that the elements of the connector device may be conveniently and inexpensively molded from any suitable plastic material. The device is further applicable not only to the connection of integrated circuit packages but may also be used for single or plural discrete components as well. Although the illustrated embodiment closes such as to deflect the component leads inwardly it will be understood that the principles of the invention apply equally to a connector device which deflects the component leads outwardly.

From the foregoing description it will be understood that the applicant has provided a new and improved device for the solderless connection of electrical components to printed wiring cards whereby the objectives set forth hereinabove are efficiently met. Since certain changes in the above-described construction wil occur to those skilled in the art without departure from the scope of the invention it is intended that all matter contained in the description or shown in the appended drawings shall be interpreted as illustrative and not in a limiting sense.

Having described what is new and novel and desired to secure by Letters Patent, what is claimed is:

1. A device for solderlessly connecting the leads of an electrical component to a printed wiring card having a plurality of plated through holes adapted to receive said leads, said device comprising first and second substantially identical electrically inert lead deflector elements disposed on said printed wiring card in longitudinal overlapping opposition and being laterally moveable with respect to one another, each said lead deflector element having first and second end portions and a lead engaging portion extending longitudinally therebetween, means affixed to said printed wiring card for driving said lead deflector elements laterally with respect to one another, and said electrical component leads being inserted in said plated through holes transversely with respect to said lead deflector elements whereby said lead engaging portions of said lead deflector elements engage said component leads and urge them into electrical contact with said plated through holes in said printed wiring card.

2. A device as recited in claim 1 further including each said end portion having a mounting aperture disposed therethrough such that the apertures in the upper ones of the overlapping end portions are partially misaligned in the lateral direction with the apertures in the lower ones of the overlapping end portions when said end portions are in alignment, and said driving means comprises a locking post extending through the mounting apertures in each of the overlapping end portions, rotatably engaging said printed wiring card and said end portions such that rotation of said locking posts operates to drive said lead deflector elements laterally with respect to one another.

3. A device as recited in claim 2 wherein said mounting apertures are rectangular, and each said end portion is provided with an outwardly extending tab disposed such as to extend into the mounting aperture of the overlapping end portion to thereby limit the maximum lateral motion of the lead deflector elements with respect to one another.

4. A device as recited in claim 2 wherein said locking post includes a cam surface portion and a friction lock portion, said friction lock portion rotatably engaging said printed wiring card, and said cam surface portion extending only through said apertures in the upper ones of said overlapping end portions when said end portions are in alignment, driving said lead deflector elements laterally with respect to one another when said locking post is rotated, and extending through said apertures in both said upper and lower ones of said overlapping end portions when said apertures are in alignment.

5. A device as recited in claim 1 wherein each said lead engaging portion is provided with a plurality of spaced apart notches for individually engaging each electrical component lead.

6. A device as recited in claim 5 further including a resilient lead engaging element disposed in and partially filling each of said notches in said lead engaging portions.

* * * * *